(12) United States Patent
Hoshino et al.

(10) Patent No.: US 7,375,757 B1
(45) Date of Patent: May 20, 2008

(54) IMAGING ELEMENT, IMAGING DEVICE, CAMERA MODULE AND CAMERA SYSTEM

(75) Inventors: Kazuhiro Hoshino, Kanagawa (JP); Hirofumi Sumi, Kanagawa (JP); Kazuya Yonemoto, Kanagawa (JP)

(73) Assignee: Sony Corporation (JP)

( * ) Notice: Subject to any disclaimer, the term of this patent is extended or adjusted under 35 U.S.C. 154(b) by 931 days.

(21) Appl. No.: 09/652,150

(22) Filed: Aug. 31, 2000

(30) Foreign Application Priority Data

Sep. 3, 1999 (JP) .............................. P11-249473
Oct. 29, 1999 (JP) .............................. P11-308312

(51) Int. Cl.
*H04N 5/225* (2006.01)
(52) U.S. Cl. ...................................... 348/340; 348/374
(58) Field of Classification Search ............. 250/208.1; 348/335, 373, 374, 375, 340, 294, 345, 394, 348/370, 371, 222.1, 229.1, 121, 65; 359/809, 359/808; 257/700, 730, 684, 719, 708, 709, 257/711; 438/121
See application file for complete search history.

(56) References Cited

U.S. PATENT DOCUMENTS

| | | | | |
|---|---|---|---|---|
| 5,040,069 A | * | 8/1991 | Matsumoto et al. | 348/76 |
| 5,130,804 A | * | 7/1992 | Tamura et al. | 348/231.7 |
| 5,418,566 A | * | 5/1995 | Kameishi | 348/294 |
| 5,561,458 A | * | 10/1996 | Cronin et al. | 348/64 |
| 5,617,131 A | * | 4/1997 | Murano et al. | 347/233 |
| 5,777,335 A | * | 7/1998 | Mochizuki et al. | 250/370.09 |
| 5,821,532 A | * | 10/1998 | Beaman et al. | 250/239 |
| 5,847,887 A | * | 12/1998 | Ogura et al. | 359/822 |
| 6,011,860 A | * | 1/2000 | Fujieda et al. | 382/126 |
| 6,122,009 A | * | 9/2000 | Ueda | 348/335 |
| 6,147,389 A | * | 11/2000 | Stern et al. | 257/434 |
| 6,172,351 B1 | * | 1/2001 | Kimura | 250/208.1 |
| 6,172,361 B1 | * | 1/2001 | Holberg et al. | 250/239 |

(Continued)

FOREIGN PATENT DOCUMENTS

DE 19651260 1/1998

(Continued)

OTHER PUBLICATIONS

Machine English Translation of JP 11-191865 A.*

(Continued)

*Primary Examiner*—Lin Ye
*Assistant Examiner*—Nelson D Hernández
(74) *Attorney, Agent, or Firm*—Rader Fishman & Grauer PLLC; Ronald P. Kananen

(57) ABSTRACT

The system and apparatus of the present invention are directed to a camera module in which an operational defect (generation of a ghost image) as a result of a reduction in thickness is eliminated. The camera module includes a substrate provided with a through-hole for light transmission, a light receiving portion provided on a first surface of an imaging element. The imaging element is flip chip mounted on a first side of the substrate such that the light receiving portion is exposed through the through-hole, and a shielding layer on a back surface of the imaging element wherein the back surface is opposite the first surface having the light receiving portion. A lens unit is mounted a second side of the substrate.

15 Claims, 8 Drawing Sheets

U.S. PATENT DOCUMENTS

| | | | |
|---|---|---|---|
| 6,187,522 B1 * | 2/2001 | Majumdar et al. | 430/527 |
| 6,369,435 B1 * | 4/2002 | Igel | 257/415 |
| 6,392,703 B1 * | 5/2002 | Uchino et al. | 348/373 |
| 6,512,219 B1 * | 1/2003 | Webster et al. | 250/208.1 |
| 6,571,466 B1 * | 6/2003 | Glenn et al. | 29/841 |
| 6,603,107 B2 * | 8/2003 | Miyake | 250/208.1 |
| 6,724,503 B1 * | 4/2004 | Sako et al. | 358/483 |
| 6,727,564 B2 * | 4/2004 | Shinomiya | 257/432 |
| 6,745,061 B1 * | 6/2004 | Hicks et al. | 600/344 |
| 6,768,516 B2 * | 7/2004 | Yamada et al. | 348/340 |
| 6,943,424 B1 * | 9/2005 | Kim | 257/433 |
| 7,110,033 B2 * | 9/2006 | Miyake | 348/340 |
| 7,133,076 B1 * | 11/2006 | Campbell | 348/340 |

FOREIGN PATENT DOCUMENTS

| | | | |
|---|---|---|---|
| EP | 773673 | | 5/1979 |
| JP | 4-235475 | | 8/1992 |
| JP | 07212633 A | * | 8/1995 |
| JP | 10321827 A | * | 12/1998 |
| JP | 11191865 | | 7/1999 |
| JP | 11191865 A | * | 7/1999 |
| WO | WO 9912338 A1 | * | 3/1999 |

OTHER PUBLICATIONS

English Machine Translation of Kawabe et al., JP 7-212633 A.*

Machine English Translation of JP 10-321827 A (Application published on Apr. 12, 1998).*

European Search Report Sep. 3, 2002.

* cited by examiner

IMAGING ELEMENT, IMAGING DEVICE, CAMERA MODULE AND CAMERA SYSTEM

BACKGROUND OF THE INVENTION

1. Field of the Invention

The present invention relates to an imaging element and an imaging device using the same and, further, to a camera module provided with an imaging element and a camera system using the same and an optical module.

2. Description of the Related Art

Recently, a camera module using an imaging element is required to be mounted in a small information terminal, such as a personal computer or a mobile viewphone, as a camera system including a signal processing system. With this requirement, there is a stronger demand for a reduction in the size of a camera module.

A conventionally known camera module using an imaging element, such as a CCD imaging element or a CMOS imaging element, uses as a function device an imaging device of a QFP (Quad Flat Package) type which hermetically seals a chip-shaped imaging element in a hollow package. In a well-known camera module of this type, the above-mentioned package is mounted on a substrate such as a printed circuit board, and a lens unit for image formation is mounted on the upper portion of the package.

In the case of the camera module constructed as described above, the thickness of the entire module is the sum total of the thickness of the imaging element package, the mounting substrate and the lens unit constituting the same. Thus, to achieve a reduction in the thickness of the camera module, it is necessary to reduce the thickness of each component.

At present, however, there is a limitation to a reduction in the thickness of the imaging device package, the mounting substrate and the lens unit. Thus, it is very difficult to achieve a further reduction in the thickness of the camera module.

SUMMARY OF THE INVENTION

Accordingly, it is an object of the present invention to provide an ultra thin camera module.

A camera module according to the present invention comprises a substrate provided with a through-hole for light transmission, a light receiving portion, an imaging element flip chip mounted on one side of the substrate such that the light receiving portion is exposed through the through-hole, and a lens unit mounted on the other side of the substrate so as to cover the space over the light receiving portion of the imaging element.

In the camera module construction described above, a ghost image can appear in the image actually obtained through imaging.

After carefully examining the cause of the ghost image generation, the present inventor has reached the following conclusion.

Usually, the imaging element detects light from the surface of the element where the light receiving portion and the lens are provided and supplies a thereby obtained image signal to a signal processing circuit or the like to cause the image to be displayed on a screen such as display. In the above-described conventional camera module, the imaging device is constructed such that the imaging element is mounted at the bottom of the hollow package, with the light receiving portion facing upward (in a face up state). By contrast, in the camera module construction in which flip chip mounting (bare chip mounting) is effected, the imaging element is mounted such that the light receiving portion is exposed through the through-hole with respect to the substrate provided with the through-hole for light transmission. Thus, in the former case, the back side of the imaging element is shielded from the exterior by the package, whereas in the latter case, the back side of the imaging element is exposed to the exterior.

Due to this difference in construction, in the former case, as shown in FIG. 1A, light impinging from the back surface 31 side is blocked by the package 32, whereas, in the latter case, as shown in FIG. 1B, light directly impinges upon the back surface 31 of the imaging element 30. In this situation, the silicon substrate (silicon wafer or the like) often used as the base substrate of the imaging element 30 transmits a light having an optically large wavelength (large wavelength band from the infrared range of the visible light range). Thus, in the latter case, not only the incident light from the light receiving portion side (front surface side) of the imaging element 30 but also light impinging from the element back surface 31 is transmitted through the interior of the element, and this transmitted light reaches the light receiving portion and is detected, whereby the generation of a ghost image is caused.

In view of this, a camera module according to another aspect of the present invention adopts a construction comprising a substrate provided with a through-hole for light transmission, an imaging element having on one side a light receiving portion, flip chip mounted on one side of the substrate with the light receiving portion being exposed through the through-hole, and having a shielding layer on the element back surface on the opposite side of the light receiving portion, and a lens unit mounted on the other surface of the substrate.

In the imaging element constructed as described above, due to the provision of the shielding layer on the back surface of the imaging element, when this imaging element is flip chip mounted on the substrate in a bare chip state, the light impinging upon the element back surface is blocked by the shielding layer, whereby the incident light from the element back surface is not transmitted through the interior of the element and sensed by the light receiving portion. Thus, in a camera module constructed by using such an imaging element, it is possible to prevent the generation of a ghost image attributable to the incident light from the element back surface.

DESCRIPTION OF THE PREFERRED EMBODIMENT

An embodiment of the present invention will now be described with reference to the drawings.

Figure 1A:
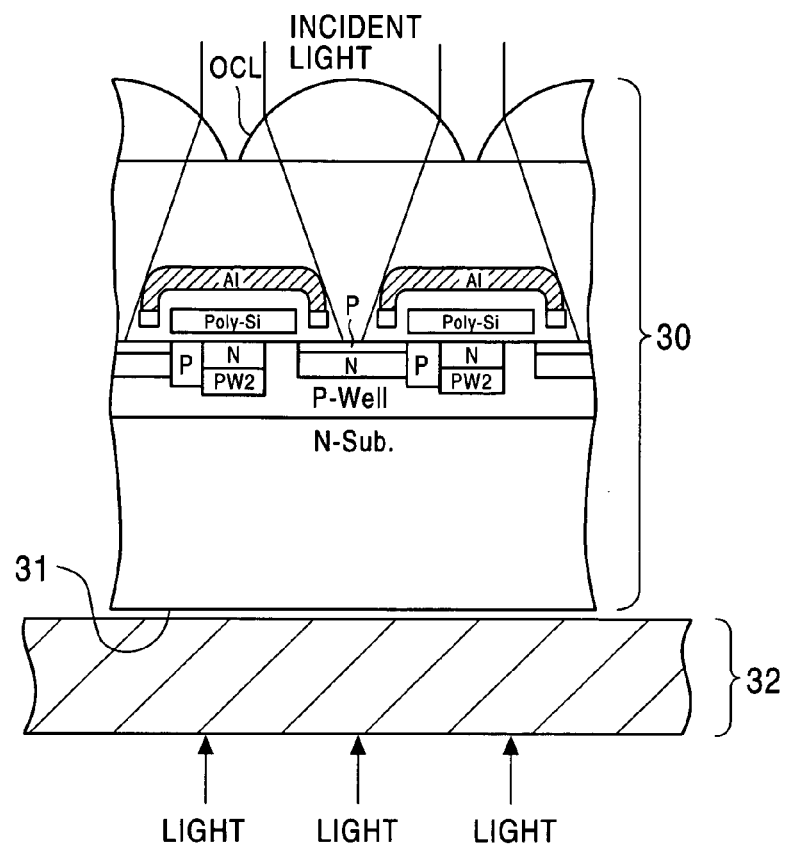
FIGS. 1A and 1B are diagrams illustrating the problem to be solved.
Figure 1B:
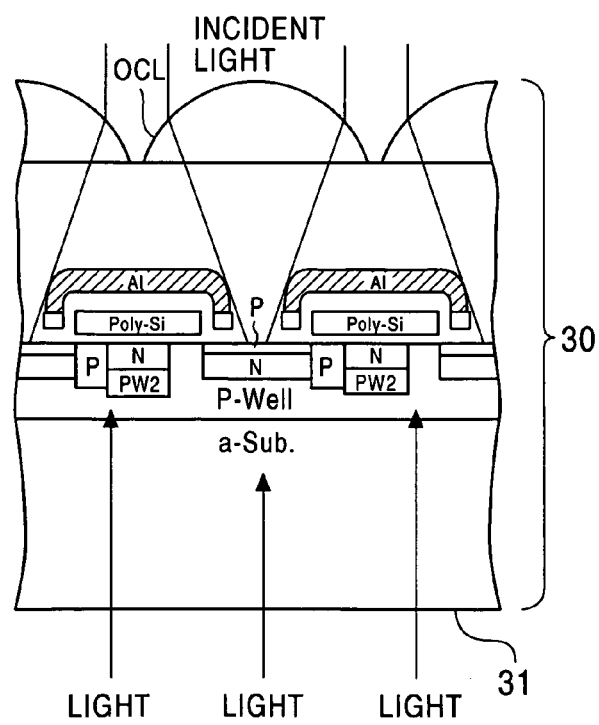
Figure 2:
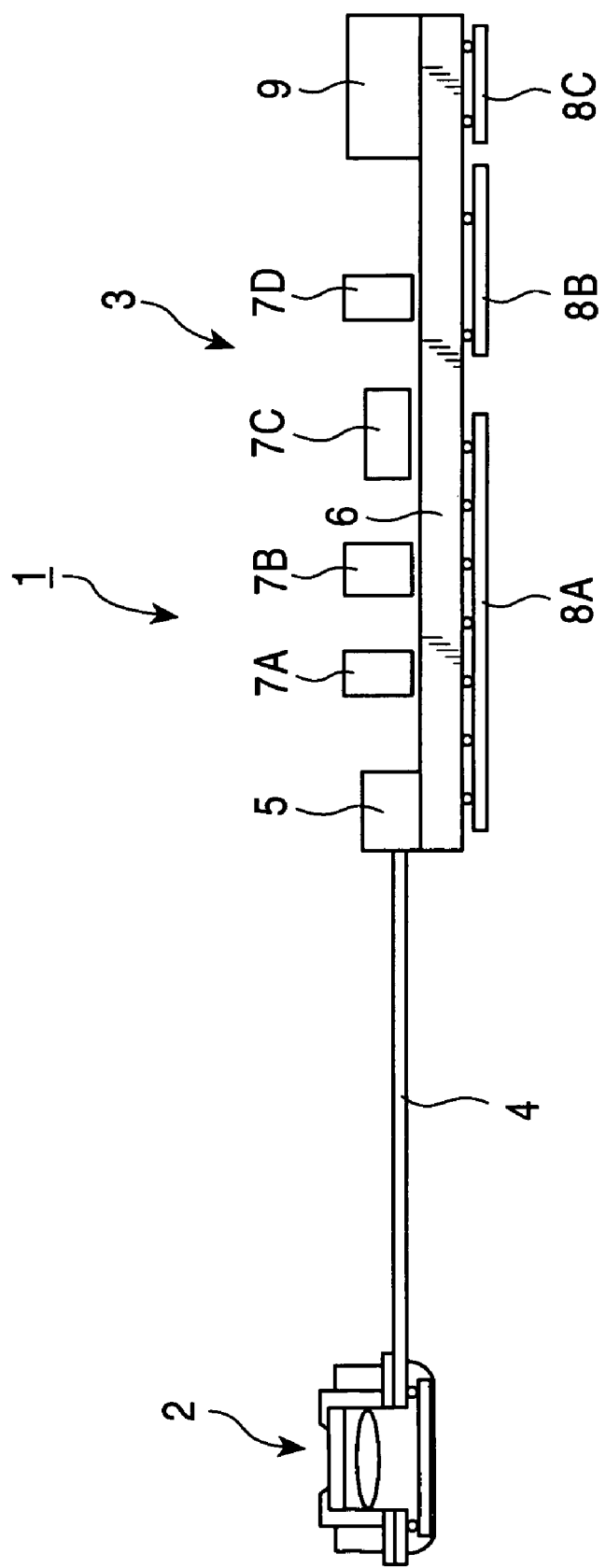
FIG. 2 is a side schematic view showing the construction of a camera system according to the present invention.

FIG. 2 is a side schematic view showing the construction of a camera system according to the present invention. The camera system 1 shown comprises a camera module 2 and a system module 3. The camera module 2 and the system module 3 are connected by a flexible wiring board 4. The flexible wiring board 4 is drawn out from the camera module 2 side, and a wiring pattern portion at the draw-out end thereof is electrically connected to a wiring pattern of the system module 3 through a connector 5.

On a wiring board 6 of the system module 3, there are double-side mounted, together with the connector 5, various electronic parts 7A through 7D and system ICs 8A through 8C. The system ICs 8A through 8C constitute a drive circuit for driving the camera module 2, an image processing circuit for performing various image processings (for example, image compression processing) on image signals obtained by the camera module 2, etc. Further, mounted on the wiring substrate 6 is a USB (Universal Serial Bus) connector 9 for connecting the camera system 1 including the system module 3 to an information terminal such as a personal computer.

Figure 3A:
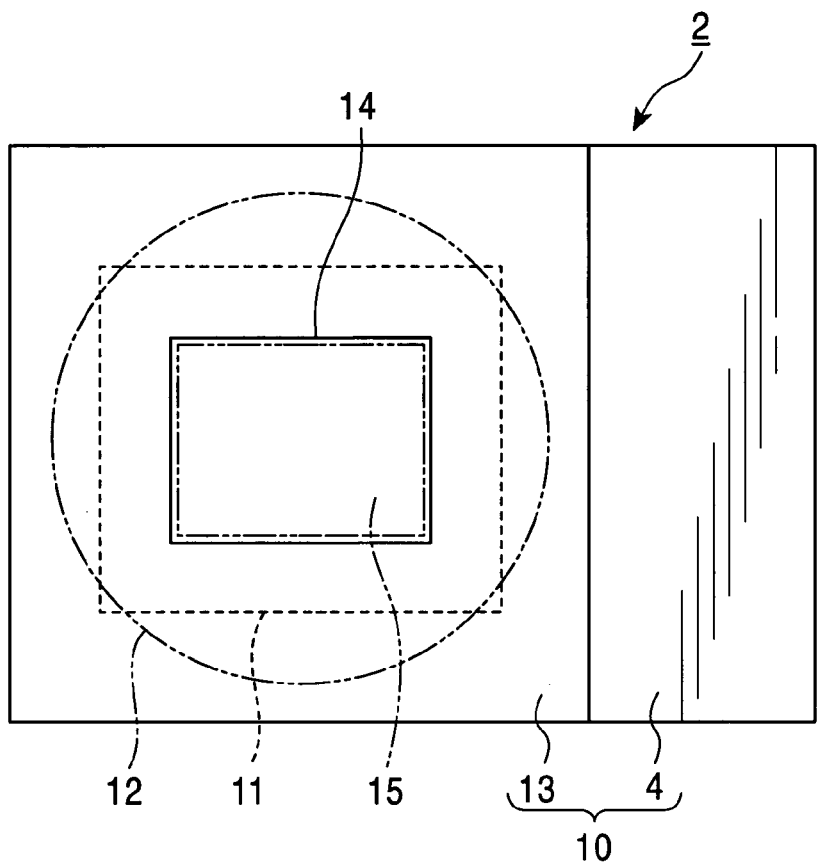
FIGS. 3A and 3B are diagrams illustrating the construction of a camera module according to an embodiment of the present invention.
Figure 3B:
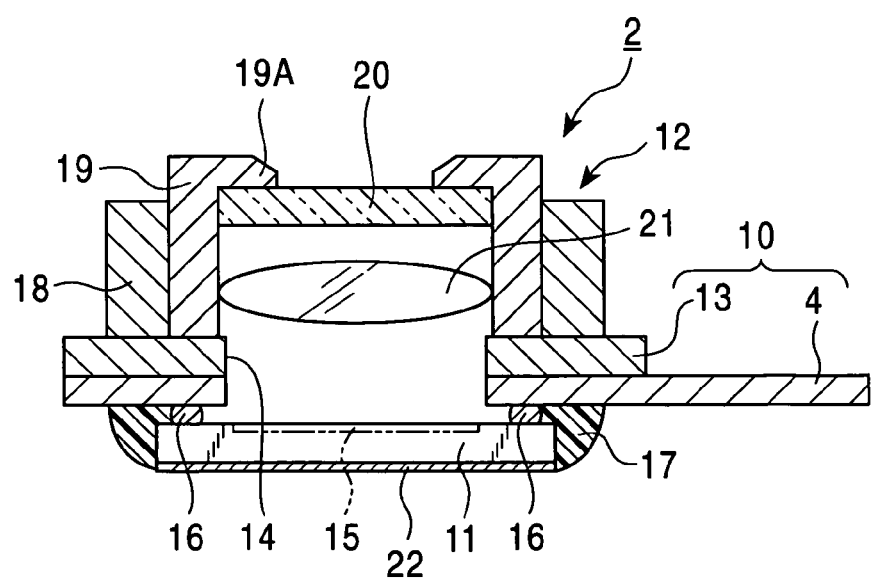

FIGS. 3A and 3B are diagrams illustrating the construction of a camera module according to an embodiment of the present invention. FIG. 3A is a schematic plan view, and FIG. 3B is a side sectional view thereof. The camera module 2 shown comprises a substrate 10, an imaging element 11 and a lens unit 12.

Figure 4:
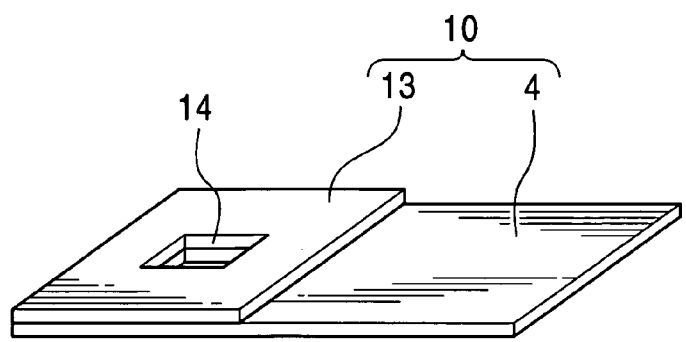
FIG. 4 is a perspective view showing the substrate structure of a camera module according to an embodiment of the present invention.

As shown in FIG. 4, the substrate 10 is formed by joining a metal plate 13 and the flexible wiring board 4 to each other by means of an adhesive (not shown) or the like. The metal plate 13 consists of a thin stainless steel plate having a thickness of, for example, approximately 0.5 mm, and a square or rectangular configuration having an outside dimension larger than that of the imaging element 11. The flexible wiring board 4 consists of a base film formed, for example, of polyester or polyimide and a wiring pattern (not shown) formed of a conductive material such as copper, and has an elongated band-shaped structure having substantially the same width as the metal plate 13. And, the metal plate 13 is glued to the end portion of the flexible wiring board 4, and, due to this glued portion, a sufficient strength (rigidity) for the substrate 10 is secured.

Further, the substrate 10 is provided with a through-hole 14 for light transmission. This through-hole 14 is provided substantially at the center of the glued portion of the flexible wiring board 4 and the metal plate 13. Further, the through-hole 14 is formed as a rectangular hole having a size corresponding to the light receiving portion of the imaging element 11 described below. By contrast, the end portion of the wiring pattern of the flexible wiring board 4 is arranged around the through-hole 14 in correspondence with the electrode position of the imaging element 11.

The metal plate 13 serves to mechanically reinforce the mounting portion and secure the positioning accuracy of the lens unit 2 in the optical axis direction when mounting the imaging element 11 and the lens unit 12 on the substrate 10 as described below. Thus, when a sufficient strength (rigidity) can be obtained by increasing the thickness of the flexible wiring board 4, there is no need to provide the metal plate 13. Further, as the substrate material, all or a part of the substrate 10 may be formed of a polyimide type organic material, a glass epoxy type organic material, or a ceramic type material. Whichever substrate material may be used, it is necessary to provide wiring pattern for electrical connection with the imaging element 11.

The imaging element consists, for example, of a CCD imaging element, a CMOS imaging element or the like, and has on its main surface a light receiving portion 15 consisting of a large number of reading pixels arranged two-dimensionally. In the periphery of the imaging element 11, there are formed a plurality of electrode portions (not shown) consisting, for example, of aluminum pads, in such a way as to surround the light receiving portion 15. This imaging element 11 is mounted (flip chip mounted) on one surface (the lower surface of the flexible wiring board 4) of the substrate 10 in a bare chip state through the intermediation of bumps 16, whereby the electrode portions (not shown) of the imaging element 11 and the wiring pattern of the flexible wiring board 4 are electrically connected through the intermediation of the bumps 16. Further, in this mounting state, the front surface (main surface) of the imaging element 11 is opposed to the substrate 10 and the light receiving portion 15 of the imaging element 11 is exposed through the through-hole 14 of the substrate 10.

On the other hand, a shielding layer 22 is provided on the surface (hereinafter referred to as the element back surface) of the imaging element 10 which is on the opposite side of the surface (main surface) on which the light receiving portion 15 of the imaging element 11 is formed. This shielding layer 22 consists, for example, of a metal layer such as aluminum, and is formed over the entire back surface of the imaging element 11. As the method of forming the shielding layer 22 consisting of a metal layer, it is possible to adopt vacuum evaporation, sputtering or the like (described in detail below).

Further, to the entire periphery of the imaging element 11, a sealing resin 17 is applied. This resin 17 serves to enhance the mechanical strength of the electrical connection portion (bump joint portion) of the imaging element 11 and the substrate 10 and to prevent intrusion of dust through the gap therebetween. As the sealing resin 17, it is desirable to adopt a resin material which involves as little gas generation as possible, for example, an epoxy resin or the like. This is because when gas generated from the sealing resin 17 adheres to the lens, the lens surface is fogged to thereby adversely affect the imaging performance.

The lens unit 12 comprises a holder 18, a lens barrel 19, an optical filter 20 and a lens 21. The holder 18 is of a cylindrical structure and the lens barrel 19 is fitted in the inner periphery thereof. In the inner peripheral surface of the holder 18 and the outer peripheral surface of the lens barrel 19, screw threads are formed as needed. By forming these screw threads and threadedly engaging the holder 18 with the lens barrel 19, these components can be relatively moved in the central axis direction (optical axis direction) to effect focusing. The forward end portion of the lens barrel 19 is bent at substantially right angles toward the central axis, whereby a diaphragm portion 19A for restricting the incident light is integrally formed.

The optical filter 20 serves as a so-called infrared cutting filter to cut off the infrared portion, for example, of the incident light impinging through the diaphragm 19A. This optical filter 20 is fixed to a position near the forward end of the lens barrel 19 in close vicinity of the diaphragm portion 19A. The lens 21 serves to effect image formation at the light receiving portion 15 of the imaging element 11 from the light impinging through the diaphragm portion 19A and the optical filter 20. This lens 21 is mounted to the interior of the lens barrel 19 together with the optical filter 20 with positioning being effected using the diaphragm portion 19A as a reference.

The optical filter 20 is not restricted to a infrared cutting filter but it is also possible to use various filters according to the imaging use (for example, an optical band pass filter). Further, it is possible to use a material having an infrared cutting function as the material (glass material) of the lens 21, or cause such a material to the surface of the lens 21 by coating, evaporation or the like to thereby provide the lens 21 itself with an infrared cutting function. In that case, there is no need to use an infrared cutting filter for the optical filter 20. Further, it is also possible to form the lens unit 12 without using the holder 18.

The lens unit 12, constructed as described above, is mounted on the other surface of the substrate 10 (the upper surface of the metal plate 13). In this mounting state, the imaging element 11 and the lens unit 12 are mounted on either side of the substrate 10 with the substrate 10 (13, 4) being therebetween. Further, the light receiving portion 15 of the imaging element 11 and the lens 21 of the lens unit 12 are opposed to each other in the same axis (optical axis) through the through-hole 14 of the substrate 10, and the space above the light receiving portion 15 of the imaging element 11 is covered with the lens unit 12.

In this camera module 2, the light receiving portion 15 of the imaging element 11 is exposed through the through-hole 14 of the substrate 10, so that when imaging is actually effected, the light impinging from the diaphragm portion 19A of the lens unit 12 through the optical filter 20 undergoes image formation at the light receiving portion 15 of the imaging element 11 by the refracting effect of the lens 21. Further, the image signal obtained through photoelectric conversion at the light receiving portion 15 of the imaging element 11, where the light is received, is transmitted to the system module 3 (See FIG. 2) through the wiring pattern of the substrate 10 (flexible wiring board 4).

Next, a camera module producing method according to an embodiment of the present invention will be described.

Figure 5:
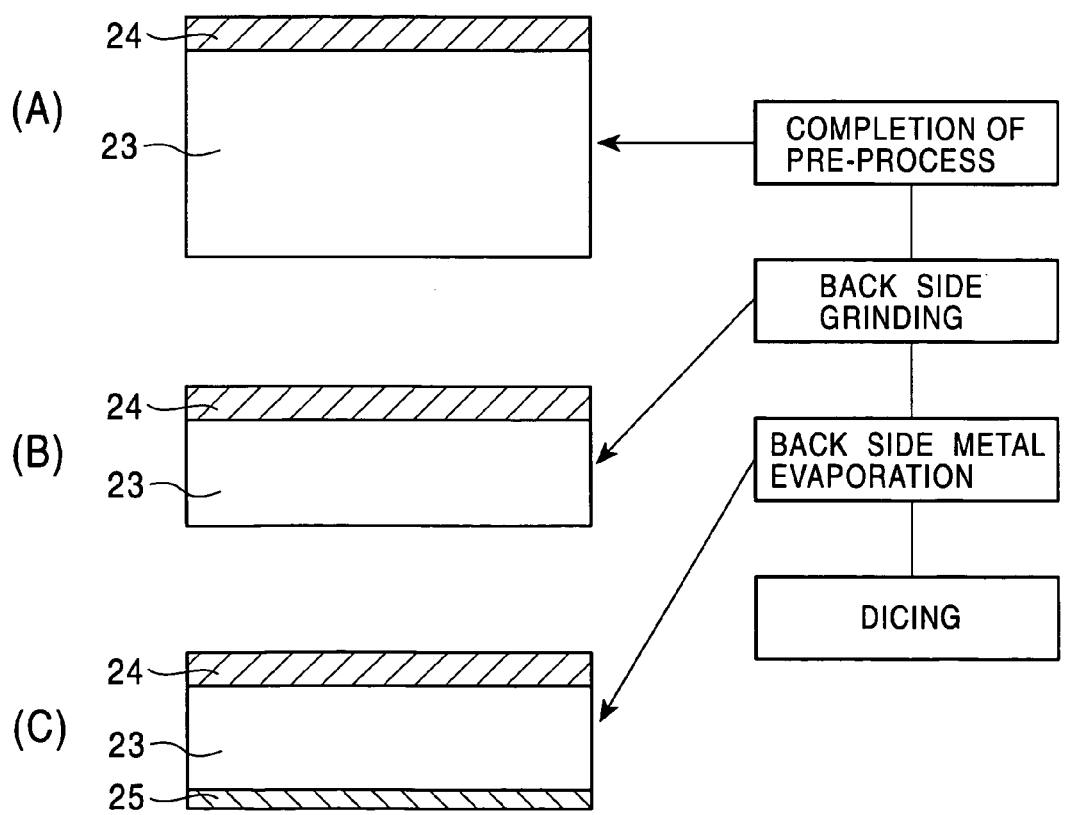
FIGS. 5A, 5B and 5C are production process diagrams of an imaging element according to an embodiment of the present invention.

First, in the production process for the imaging element 11, as shown in FIG. 5A, an element forming layer 24 including the light receiving portion 15 is formed on a wafer 23 consisting of a silicon substrate or the like, and then, as shown in FIG. 5B, the back surface of the wafer 23 is ground by a back surface grinder so that the wafer 23 may have a predetermined thickness (for example, 400 μm).

Subsequently, aluminum is deposited by vacuum evaporation on the back surface of the wafer 23 ground in the above step, whereby a metal layer 25 consisting of aluminum is formed on the back surface of the wafer 23. This vacuum evaporation using aluminum as the evaporation material (layer forming material) is conducted, for example, under the following conditions: degree of vacuum: 1 mTorr, evaporation material heating method: crucible heating, substrate (wafer) temperature: 100° C., evaporation material growth layer thickness: 3 μm. After this, dicing of the wafer 23 is effected along a predetermined cutting line, whereby a plurality of imaging elements 11 each having on its back surface a shielding layer 22 (metal layer 25) are obtained.

While in the above example vacuum evaporation is adopted as the method for forming the metal layer (aluminum layer) 25, a similar metal layer 25 can also be formed by sputtering. The conditions for sputtering may, for example, be as follows: target material: pure aluminum, base degree of vacuum: $1.0^{-8}$ Torr, degree of vacuum at the time of sputtering: 5 mTorr, gas introduced: argon gas, substrate temperature: 100° C., growth layer thickness: 3 μm. Further, it is also possible to use other metals such as gold, silver, tungsten, and molybdenum as the material for the metal layer 25 constituting the shielding layer 22.

On the other hand, in the process for producing the substrate 10, as shown in FIG. 4, the metal plate 13 and the flexible wiring board 4 are glued to each other by using an adhesive or the like, and then the through-hole 14 is formed, for example, by stamping, substantially at the center of the glued portion. It is also possible to form the through-hole 14 beforehand in both the metal plate 13 and the flexible wiring board 4 before they are glued together.

Figure 6A:
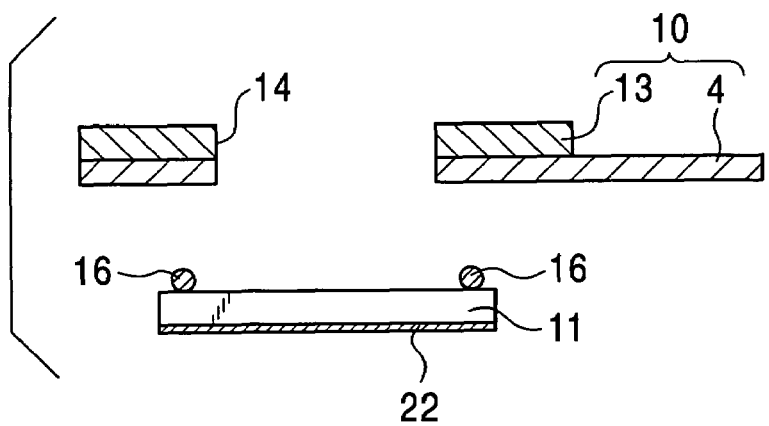
FIGS. 6A, 6B, 6C and 6D are production process diagrams of a camera module according to an embodiment of the present invention.
Figure 7A:
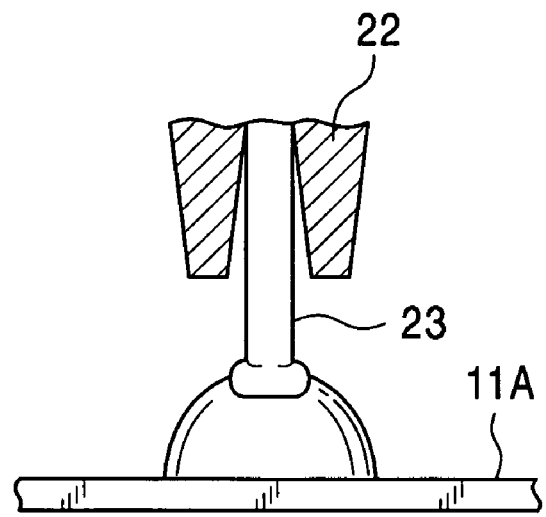
FIGS. 7A and 7B are diagrams illustrating an example of the bump forming method.
Figure 7B:
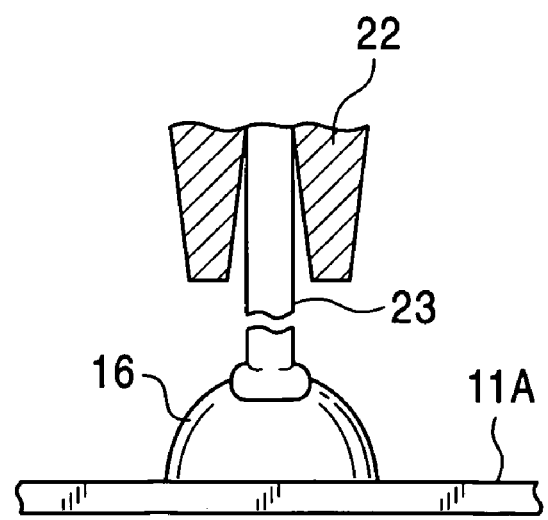

When the imaging element 11 and the substrate 10 have been thus prepared, a bump 16 is formed on each electrode portion of the imaging element 11, as shown in FIG. 6A. The bump 16 can be formed, for example, as follows, as shown in FIG. 7A. A ball is formed at the forward end of a gold wire drawn out from the forward end of a capillary 22, and this is crimped to the electrode portion (aluminum pad) 11A of the imaging element 11. Then, as shown in FIG. 7B, the gold wire 23 is cut at the ball portion, without drawing the gold wire 23 out of the capillary 22. This bump forming method is called a ball bump method (or stud bump method). Apart from this, it is also possible to adopt a bump forming method such as electroless plating, transfer bump method or soldering technique.

Figure 6B:
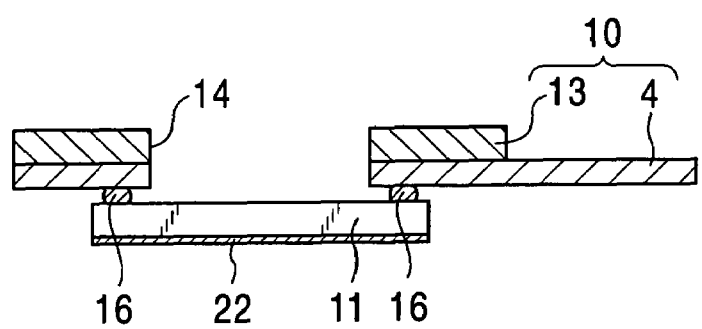

Next, as shown in FIG. 6B, the imaging element 11 is mounted (flip chip mounted) on one surface of the substrate 10 through the intermediation of the bumps 16. In this mounting process, the substrate 10 is placed on a base (not shown), and the imaging element 11 held by a bonding tool (not shown). And, in the condition in which positioning is effected between the substrate 10 on the base and the imaging element 11 held by the bonding tool, the bumps 16 formed on the electrode portions of the imaging element 11 are electrically and mechanically connected to the wiring pattern of the substrate 10 (flexible wiring board 4) by ultrasonic connection.

The alignment of the substrate 10 and the imaging element 11 is conducted under the condition in which in a direction perpendicular to the direction in which pressurizing is effected by the bonding tool (generally speaking, in the horizontal direction), the positions of the through-hole 14 of the substrate 10 and the light receiving portion 15 of the imaging element 11 and the position of the wiring pattern of the substrate 10 and the electrode portions of the imaging element corresponding thereto coincide with each other. The ultrasonic connection is effected, for example, under the following conditions: frequency: 50 KHz, tool temperature 100° C., base temperature: 100° C., connection time: 0.5 sec, tool pressurizing force: 100 g per bump, amplitude 2.5 μm.

It is desirable that the heating temperature at the time of ultrasonic connection be set not higher than 170° C. so that a micro lens formed on the main surface (light receiving portion 15) of the imaging element 11 may not thermally damaged. In ultrasonic connection, processing can be effected at a temperature of approximately 130° C., so that there is no fear of the micro lens being thermally damaged. However, as the connection method for mounting the imaging element 11 on the substrate 10, it is also possible to adopt a connection method other than ultrasonic connection as long as low temperature connection satisfying the above temperature condition (not higher than 170° C.) is realized. Specifically, it might possible to adopt connection using silver paste or connection using indium, or a connection method using an anisotropic conductive material.

Figure 6C:
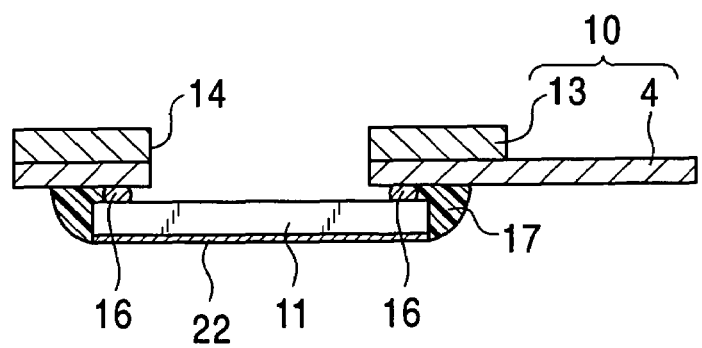

Next, as shown in FIG. 6C, a sealing resin (underfill material) 17 is applied to the periphery of the imaging element 11 by using a dispenser or the like. At this time, a resin 17 having an appropriate viscosity is used, whereby the resin 17 applied by the dispenser or the like is prevented from flowing to the light receiving portion 15 of the imaging element 11. After the application of the resin 17, it is cured by air drying or heat processing. As the material of the resin 17, a phenol-novolak type epoxy resin, for example, is used. The curing condition in the above heat treatment, is 2 hours at 120° C.

Figure 6D:
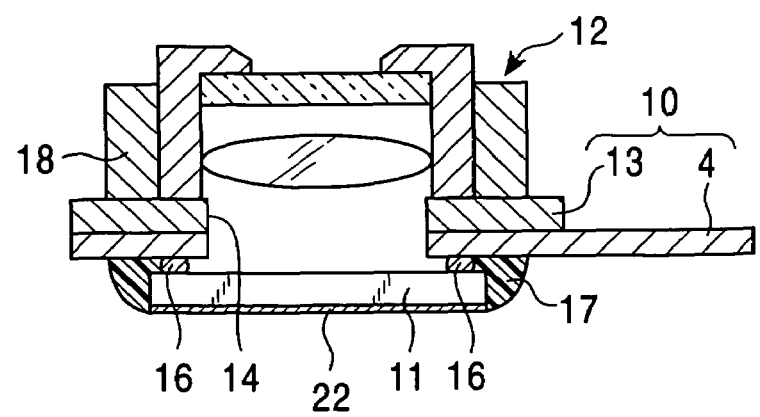

Subsequently, as shown in FIG. 6D, the lens unit 12 which has been assembled beforehand is mounted on the other surface of the substrate 10. In this mounting process, an epoxy type adhesive (not shown), for example, is applied to the end surface of the holder 18 of the lens unit 12 or the other surface of the substrate 10 corresponding to the mounting position of the lens unit 12. After this, with the lens unit 12 and the imaging element 11 being aligned, the lens unit 12 is pressed against the other surface of the substrate 10, whereby the lens unit 12 is fastened to the substrate 10 through the intermediation of the above adhesive. In this way, the camera module 2 shown in FIGS. 3A and 3B is obtained.

When forming the shielding layer 22 consisting of a metal layer on the back surface of the imaging element 11, apart from forming it by vacuum evaporation or the like in the production process for the imaging element 11 as described above, it is also possible to form the shielding layer 22 consisting of a metal layer on the back surface of the element by mounting the imaging element 11 obtained by dicing the wafer 23 on the substrate 10 or mounting the lens unit 12 on the substrate 10, and then applying a metal paste (silver paste or the like) to, for example, the back surface of the imaging element.

In the camera module 2 obtained in this way, the imaging element 11 is directly mounted by flip chip mounting to one side of the substrate 10 having the through-hole 14, and the lens unit 12 is mounted on the opposite side, i.e., to the other side of the substrate 10, so that, compared to the conventional module construction, it is possible to reduce the package thickness to hermetically seal the imaging element, and it is possible to arrange the substrate 10, the imaging element 11 and the lens unit 12 more densely in the module thickness direction, whereby it is possible to provide an ultra thin camera module 2. Further, in the camera system 1 using this camera module 2, due to the reduction in the thickness of the camera module 2, it is possible to incorporate it in an information terminal utilizing a smaller mounting space.

Figure 8:
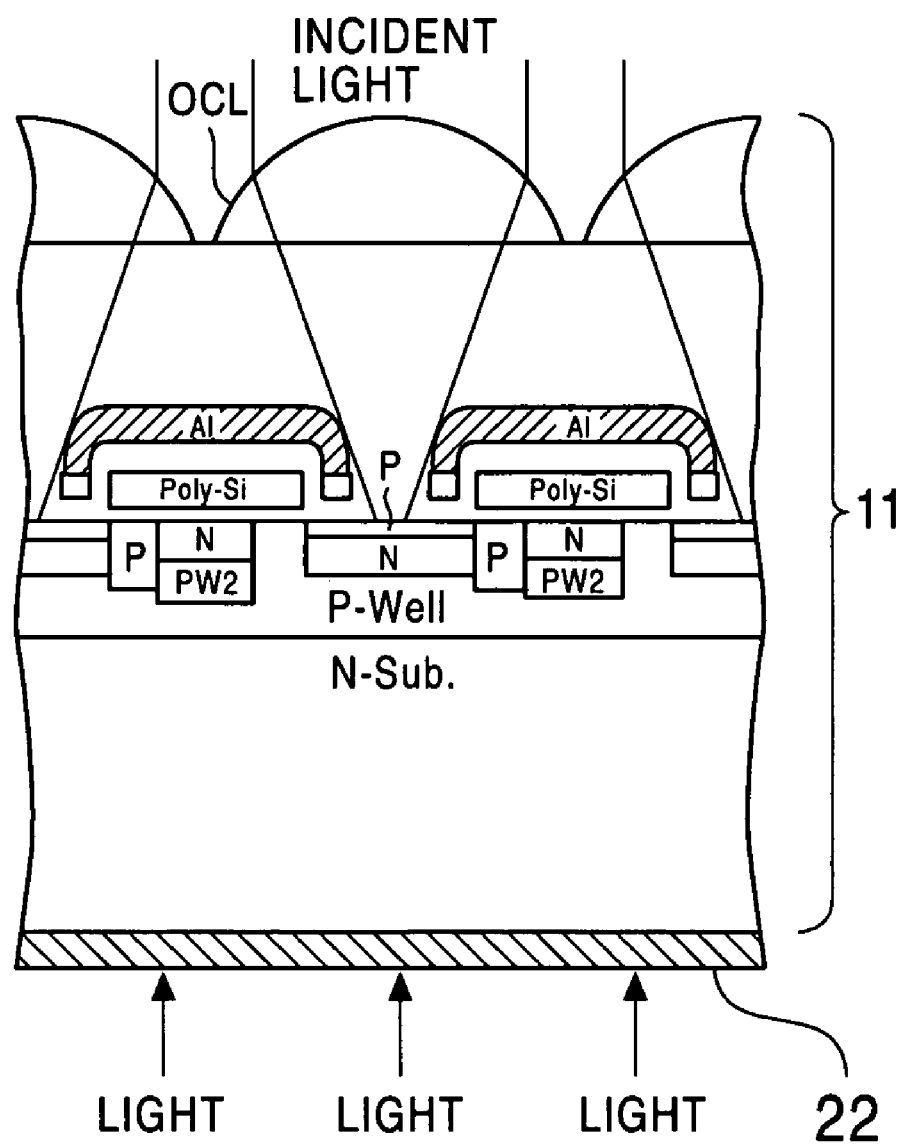
FIG. 8 is a diagram illustrating the advantage of the present invention.

Further, since the shielding layer 22 is formed on the back surface of the imaging element 11, even if the mounting is effected such that the back surface of the element is exposed to the exterior, it is possible, as shown in FIG. 8, to cut off light impinging from the back side of the imaging element 11 by the shielding layer 22, whereby the incident light from the back side of the element (long wavelength light or the like) is not allowed to be transmitted through the interior of the imaging element 11 and sensed by the light receiving portion 15. Thus, even when image taking is actually effected by the camera module 2, it is possible to prevent the generation of a ghost image or noise attributable to the incident light from the element back side, making it possible to obtain a satisfactory image.

Further, in this embodiment, the imaging element 11 is connected to the flexible wiring board 4, so that it is possible to freely change the orientation of the camera module 2 utilizing the flexibility of the flexible wiring board 4, whereby, when incorporating the camera module 2 in an information terminal product, it is possible to arbitrarily adjust the mounting angle of the camera module 2, thereby substantially enhancing the degree of freedom at the time of mounting.

Further, in the production of this camera module 2, there is no need to perform a package process for hermetically sealing the imaging element 11, so that it is possible to realize a reduction in cost through improvement in productivity.

Figure 9A:
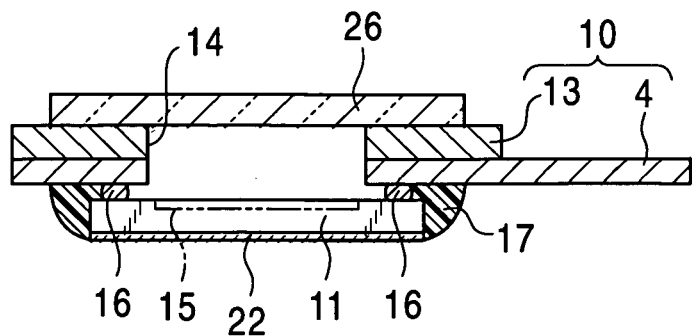
FIGS. 9A and 9B are diagrams illustrating another application example of the present invention.
Figure 9B:
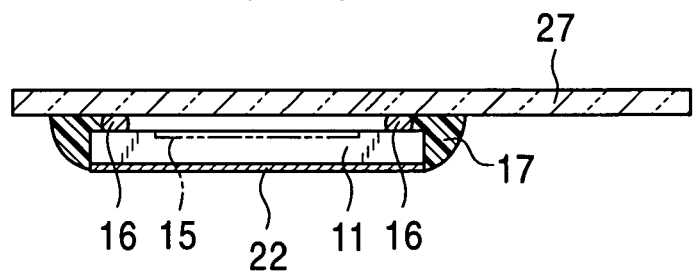

While the above-described embodiment is applied to the camera module 2 comprising the substrate 10, the imaging element 11 and the lens unit 12, this should not be construed restrictively. For example, the present invention is also applicable to an imaging device in which, as shown in FIG. 9A, instead of the lens unit 12, the through-hole 14 of the substrate 10 is closed by a light transmitting plate-like member 26 such as a seal glass or an optical filter substrate, or an imaging device in which, as shown in FIG. 9B, the imaging element 11 is flip chip mounted in a bare chip state to a transparent glass substrate (or an optical filter substrate or the like) 27.

Further, while in the above-described embodiment the shielding layer 22 consisting of a metal layer is formed by vacuum evaporation on the back surface of the imaging element, this should not be construed restrictively. Apart from this, for example, it is possible to apply a black resin (epoxy resin, silicone resin or the like) to the back surface of the imaging element 11 to make it black or form a transparent resin layer on the back surface of the element and then apply a material containing black ink to the surface of the resin layer to make it black, thereby forming a resin shielding layer 22 on the back surface of the element.

Figure 10:
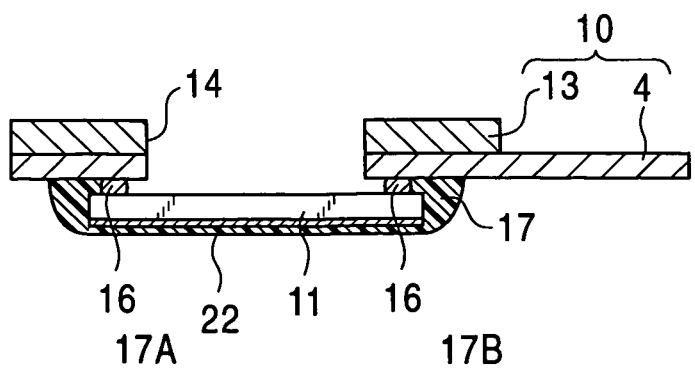
FIG. 10 is a diagram illustrating another embodiment of the present invention.

When thus forming the shielding layer 22 using a resin, there is no need to form the shielding layer 22 in the process for producing the imaging element 11. By applying a black resin (sealing resin) 17 so as to cover the back and side surfaces of the imaging element in the processing step shown in FIG. 6C, it is possible to form the shielding layer 22 with a part (portion corresponding to the back surface of the element) 17A of the resin 17, as shown in FIG. 10, and enhance the joint strength between the imaging element 11 and the substrate 10 with the other portion (portion corresponding to the side surface of the element) 17B to prevent separation, etc.

As described above, in accordance with the present invention, the imaging element is constructed such that a shielding layer is provided on the back surface of the element on the opposite side of the light receiving portion, so that when realizing a thin imaging device or camera module using this imaging element, light impinging from the back side of the element is cut off by the shielding layer, and it is possible to prevent the generation of a ghost image of the like attributable to the incident light, whereby it is possible to provide an imaging device or camera module which is very thin and has high imaging performance.

What is claimed is:

1. An optical system having an optical module, the optical module comprising:
    an optical element including a light receiving portion, said light receiving portion being between a shielding layer and a lens;
    an optical filter between said lens and a diaphragm portion of a lens barrel, an opening through said diaphragm portion exposing said optical filter;

a plate between said lens barrel and a wiring board, said wiring board being between said optical element and said plate, wherein said plate is of a first material, said wiring board being of a material other than said first material, wherein said light receiving portion and said lens are disposed along an optical axis, wherein a through-hole extends through said lens barrel, said plate, and said wiring board, wherein said optical axis extends through said opening, said optical filter, and said through-hole, wherein said lens barrel is in an inner periphery of a holder, said plate being between said holder and said wiring board.

2. The optical system of claim 1, wherein said optical filter and said lens are moveable in a direction along said optical axis.

3. The optical system of claim 1, wherein said optical filter is an infrared cutting filter.

4. The optical system of claim 1, wherein said lens barrel contacts said holder.

5. The optical system of claim 1, wherein said diaphragm portion contacts said optical filter.

6. The optical system of claim 1, wherein said lens barrel contacts said lens.

7. The optical system of claim 1, wherein said lens barrel contacts said plate.

8. The optical system of claim 1, wherein said plate contacts said wiring board.

9. The optical system of claim 1, wherein bumps electrically connect said wiring board with said optical element.

10. The optical system of claim 1, wherein said first material is a metal.

11. The optical system of claim 1, wherein the shielding layer is a metal layer.

12. The optical system of claim 1, wherein said shielding layer is a resin layer.

13. The optical system of claim 12, wherein a portion of said resin layer is in contact with said wiring board.

14. An imaging device comprising:
the optical system according to claim 1.

15. A camera system using a camera module comprising:
the optical system according to claim 1.

* * * * *